US011881416B2

(12) United States Patent
Chakravarthy et al.

(10) Patent No.: US 11,881,416 B2
(45) Date of Patent: Jan. 23, 2024

(54) GAS DELIVERY SYSTEM FOR A SHARED GAS DELIVERY ARCHITECTURE

(71) Applicant: Applied Materials, Inc., Santa Clara, CA (US)

(72) Inventors: Arun Chakravarthy Chakravarthy, Panruti (IN); Chahal Neema, Mountain View, CA (US); Abhijit A. Kangude, Mountain View, CA (US); Elizabeth Neville, Sunnyvale, CA (US); Vishal S. Jamakhandi, Bengaluru (IN); Kurt R. Langeland, San Jose, CA (US); Syed A. Alam, San Jose, CA (US); Ming Xu, San Jose, CA (US); Kenneth Le, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 65 days.

(21) Appl. No.: 17/120,976

(22) Filed: Dec. 14, 2020

(65) Prior Publication Data

US 2022/0189793 A1    Jun. 16, 2022

(51) Int. Cl.
*H01L 21/67* (2006.01)
*H01J 37/32* (2006.01)

(52) U.S. Cl.
CPC .... *H01L 21/67017* (2013.01); *H01J 37/3244* (2013.01); *H01J 37/32357* (2013.01);
(Continued)

(58) Field of Classification Search
None
See application file for complete search history.

(56) References Cited

U.S. PATENT DOCUMENTS 6,495,233 B1 * 12/2002 Shmurun ............ C23C 16/5096
                                                     118/724
6,878,206 B2 *  4/2005 Tzu ................... C23C 16/45512
                                                     118/728
(Continued)

FOREIGN PATENT DOCUMENTS

JP       5315898 B2    10/2013
KR  10-1830322 B1     2/2018
(Continued)

OTHER PUBLICATIONS

International Search Report and Written Opinion dated Apr. 7, 2022 in International Patent Application No. PCT/US2021/062760, 7 pages.

*Primary Examiner* — Karla A Moore
(74) *Attorney, Agent, or Firm* — Kilpatrick Townsend & Stockton LLP

(57) ABSTRACT

Exemplary substrate processing systems may include a lid plate. The systems may include a gas splitter seated on the lid plate. The gas splitter may define a plurality of gas inlets and gas outlets. A number of gas outlets may be greater than a number of gas inlets. The systems may include a plurality of valve blocks that are interfaced with the gas splitter. Each valve block may define a number of gas lumens. An inlet of each of the gas lumens may be in fluid communication with one of the gas outlets. An interface between the gas splitter and each of the valve blocks may include a choke. The systems may include a plurality of output manifolds seated on the lid plate. The systems may include a plurality of output weldments that may couple an outlet of one of the gas lumens with one of the output manifolds.

19 Claims, 10 Drawing Sheets

(52) U.S. Cl.
CPC .. *H01J 37/32899* (2013.01); *H01L 21/67167* (2013.01); *H01J 2237/006* (2013.01)

(56) References Cited

U.S. PATENT DOCUMENTS

| | | | |
|---|---|---|---|
| 6,962,644 B2 * | 11/2005 | Paterson | H01J 37/32458 |
| | | | 156/345.31 |
| 2003/0005958 A1 | 1/2003 | Rocha-Alvarez et al. | |
| 2003/0213560 A1 | 11/2003 | Wang et al. | |
| 2004/0007176 A1 * | 1/2004 | Janakiraman | H01L 21/67754 |
| | | | 427/248.1 |
| 2004/0025787 A1 | 2/2004 | Selbrede et al. | |
| 2005/0229848 A1 | 10/2005 | Shinriki et al. | |
| 2017/0335456 A1 * | 11/2017 | Nguyen | C23C 16/4558 |
| 2022/0130687 A1 * | 4/2022 | Rajeev | C23C 16/45565 |
| 2023/0124246 A1 * | 4/2023 | Chakravarthy | H01J 37/32743 |
| | | | 427/569 |
| 2023/0139688 A1 * | 5/2023 | Benjamin Raj | B01F 25/4331 |
| | | | 366/341 |

FOREIGN PATENT DOCUMENTS

| | | |
|---|---|---|
| TW | 201009977 A | 3/2010 |
| TW | 201634718 A | 10/2016 |

\* cited by examiner

GAS DELIVERY SYSTEM FOR A SHARED GAS DELIVERY ARCHITECTURE

TECHNICAL FIELD

The present technology relates to semiconductor processes and equipment. More specifically, the present technology relates to substrate processing systems and components.

BACKGROUND

Semiconductor processing systems often utilize cluster tools to integrate a number of process chambers together. This configuration may facilitate the performance of several sequential processing operations without removing the substrate from a controlled processing environment, or it may allow a similar process to be performed on multiple substrates at once in the varying chambers. These chambers may include, for example, degas chambers, pretreatment chambers, transfer chambers, chemical vapor deposition chambers, physical vapor deposition chambers, etch chambers, metrology chambers, and other chambers. The combination of chambers in a cluster tool, as well as the operating conditions and parameters under which these chambers are run, are selected to fabricate specific structures using particular process recipes and process flows.

Cluster tools often process a number of substrates by continuously passing substrates through a series of chambers and process operations. The process recipes and sequences will typically be programmed into a microprocessor controller that will direct, control, and monitor the processing of each substrate through the cluster tool. Once an entire cassette of wafers has been successfully processed through the cluster tool, the cassette may be passed to yet another cluster tool or stand-alone tool, such as a chemical mechanical polisher, for further processing.

Robots are typically used to transfer the wafers through the various processing and holding chambers. The amount of time required for each process and handling operation has a direct impact on the throughput of substrates per unit of time. Substrate throughput in a cluster tool may be directly related to the speed of the substrate handling robot positioned in a transfer chamber. As processing chamber configurations are further developed, conventional wafer transfer systems may be inadequate. Additionally, as cluster tools scale, component configurations may no longer adequately support processing or maintenance operations.

Thus, there is a need for improved systems and methods that can be used to efficiently direct substrates within cluster tool environments. These and other needs are addressed by the present technology.

SUMMARY

Exemplary substrate processing systems may include a lid plate. The systems may include a gas splitter seated on the lid plate. The gas splitter may define a plurality of gas inlets and a plurality of gas outlets. A number of the plurality of gas outlets may be greater than a number of the plurality of gas inlets. The systems may include a plurality of valve blocks that are each interfaced with the gas splitter. Each of the plurality of valve blocks may define a number of gas lumens. An inlet of each of the gas lumens may be in fluid communication with one of the plurality of gas outlets. An interface between the gas splitter and each of the plurality of valve blocks may include a choke having a diameter that is less than a diameter of each of the plurality of gas outlets and of each of the inlets of the gas lumens. The systems may include a plurality of output manifolds seated on the lid plate. The systems may include a plurality of output weldments. Each output weldment may fluidly couple an outlet of one of the gas lumens with a respective one of the output manifolds. In some embodiments, one of the gas lumens of each of the plurality of valve blocks may define a divert lumen that directs gases away from a processing chamber. The gas splitter may define a plurality of gas channels that extend between the plurality of gas inlets and the plurality of gas outlets. At least one of the plurality of gas channels may split gas flow from a single gas inlet to two gas outlets. The systems may include a plurality of input weldments that fluidly couple a plurality of gas sources with the gas inputs of the gas splitter. Each of the gas splitter and the plurality of valve blocks may include a heat source. The systems may include a remote plasma unit supported above the gas splitter. The remote plasma unit may be fluidly coupled with each of the plurality of output manifolds. The systems may include a center manifold coupled with an outlet of the remote plasma unit. The systems may include a plurality of side manifolds that are each fluidly coupled with one of a plurality of outlet ports of the center manifold. Each of the plurality of side manifolds may define a gas lumen that is fluidly coupled with one of the plurality of output manifolds. Each of the plurality of side manifolds may include a cooling channel that extends along at least a portion of a length of the side manifold. The systems may include a plurality of processing chambers positioned below the lid plate. Each processing chamber may define a processing region that is fluidly coupled with one of the plurality of output manifolds.

Some embodiments of the present technology may also encompass substrate processing systems. The systems may include a gas splitter defining a plurality of gas inlets and a plurality of gas outlets. A number of the plurality of gas outlets may be greater than a number of the plurality of gas inlets. The systems may include a plurality of valve blocks that are each interfaced with the gas splitter. Each of the plurality of valve blocks may define a number of gas lumens. An inlet of each of the gas lumens may be in fluid communication with one of the plurality of gas outlets. An interface between the gas splitter and each of the plurality of valve blocks may include a choke having a diameter that is less than a diameter of each of the plurality of gas outlets and of each of the inlets of the gas lumens. The systems may include a plurality of output weldments. Each output weldment may fluidly couple an outlet of one of the gas lumens with one of a plurality of output manifolds.

In some embodiments, the systems may include a plurality of valves coupled with each of the valve blocks. The systems may include a plurality of input weldments that fluidly couple a plurality of gas sources with the gas inputs of the gas splitter. At least some of the plurality of input weldments may include a single input and may define gas channels that split flow from the single input to a plurality of outputs. The systems may include a heater jacket positioned about each of the plurality of input weldments. The systems may include a remote plasma unit supported above the gas splitter. The remote plasma unit may be fluidly coupled with each of the plurality of output manifolds. The systems may include a support structure that elevates the remote plasma unit above a top surface of the gas splitter. The support structure may include three support legs. The plurality of input weldments may extend between two of the support legs. The systems may include a plurality of isolation valves. Each of the plurality of isolation valves may be fluidly coupled between the remote plasma unit and one of the plurality of output manifolds. The systems may include a lid plate that supports each of the plurality of output manifolds. The systems may include a plurality of processing chambers positioned below the lid plate. Each processing chamber may define a processing region that is fluidly coupled with one of the plurality of output manifolds.

Some embodiments of the present technology may also encompass substrate processing systems. The systems may include a plurality of processing chambers. Each processing chamber may define a processing region. The systems may include a lid plate positioned above the plurality of processing chambers. The systems may include a plurality of output manifolds seated on the lid plate. Each of the plurality of output manifolds may be in fluid communication with the processing region of one of the plurality of processing chambers. The systems may include a gas splitter seated on the lid plate. The gas splitter may define a plurality of gas inlets and a plurality of gas outlets. The systems may include a plurality of valve blocks that are each interfaced with the gas splitter. Each of the plurality of valve blocks may define a number of gas lumens. An inlet of each of the gas lumens may be in fluid communication with one of the plurality of gas outlets. An interface between the gas splitter and each of the plurality of valve blocks may include a choke having a diameter that is less than a diameter of each of the plurality of gas outlets and of each of the inlets of the gas lumens. The systems may include a plurality of weldments. Each weldment may fluidly couple an outlet of one of the gas lumens with a respective one of the output manifolds.

Such technology may provide numerous benefits over conventional systems and techniques. For example, the processing systems may provide multi-substrate processing capabilities that may be scaled well beyond conventional designs. Additionally, the processing systems may provide equal flow splitting between multiple chambers, while preventing cross-talk between the chambers. The processing systems may also provide the ability to tune deposition rates using divert flow paths. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
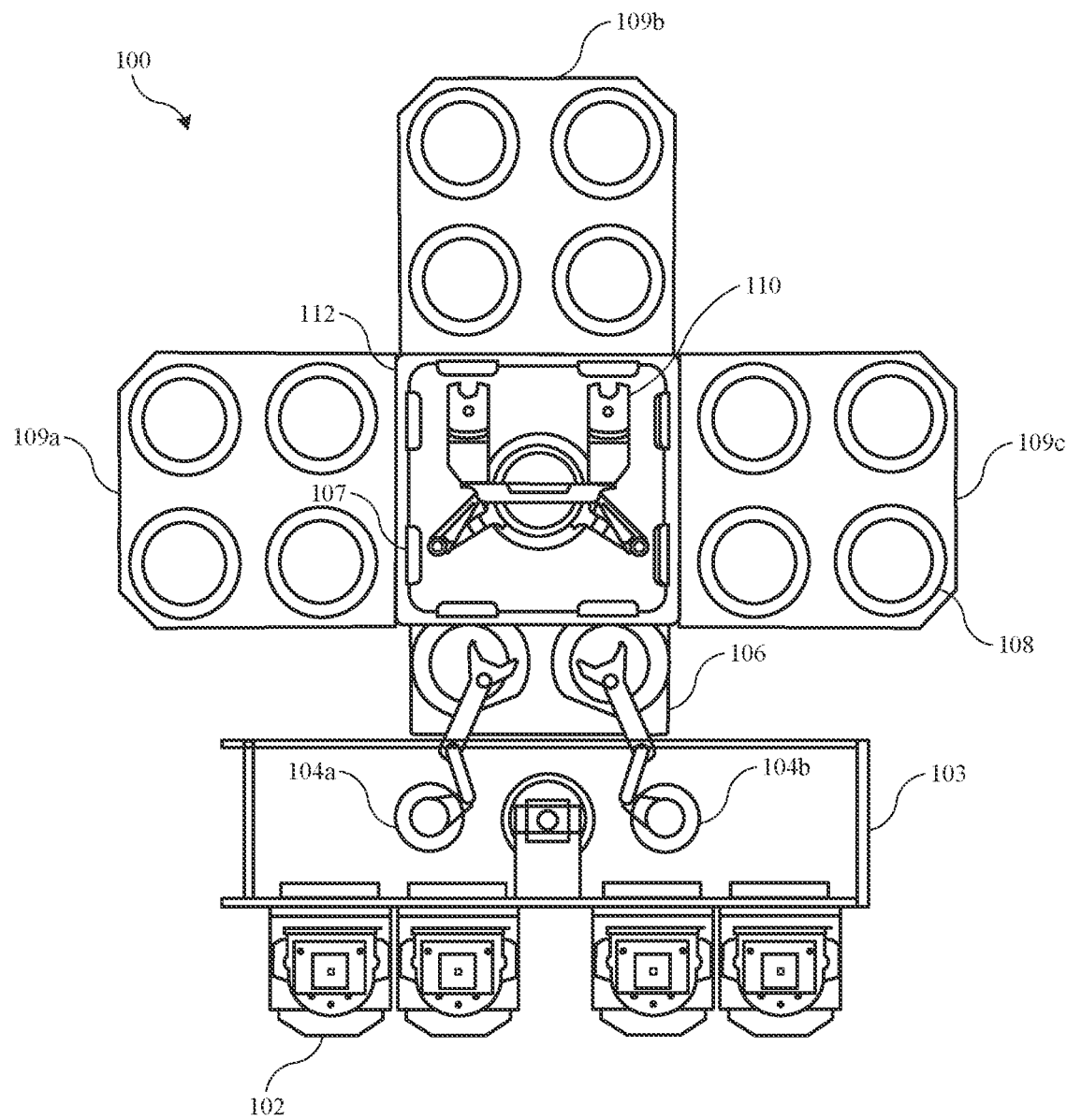
FIG. 1 shows a schematic top plan view of an exemplary processing system according to some embodiments of the present technology.

Several of the figures are included as schematics. It is to be understood that the figures are for illustrative purposes, and are not to be considered of scale or proportion unless specifically stated to be of scale or proportion. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Substrate processing can include time-intensive operations for adding, removing, or otherwise modifying materials on a wafer or semiconductor substrate. Efficient movement of the substrate may reduce queue times and improve substrate throughput. To improve the number of substrates processed within a cluster tool, additional chambers may be incorporated onto the mainframe. Although transfer robots and processing chambers can be continually added by lengthening the tool, this may become space inefficient as the footprint of the cluster tool scales. Accordingly, the present technology may include cluster tools with an increased number of processing chambers within a defined footprint. To accommodate the limited footprint about transfer robots, the present technology may increase the number of processing chambers laterally outward from the robot. For example, some conventional cluster tools may include one or two processing chambers positioned about sections of a centrally located transfer robot to maximize the number of chambers radially about the robot. The present technology may expand on this concept by incorporating additional chambers laterally outward as another row or group of chambers. For example, the present technology may be applied with cluster tools including three, four, five, six, or more processing chambers accessible at each of one or more robot access positions.

However, as additional process locations are added, accessing these locations from a central robot may no longer be feasible without additional transfer capabilities at each location. Some conventional technologies may include wafer carriers on which the substrates remain seated during transition. However, wafer carriers may contribute to thermal non-uniformity and particle contamination on substrates. The present technology overcomes these issues by incorporating a transfer section vertically aligned with processing chamber regions and a carousel or transfer apparatus that may operate in concert with a central robot to access additional wafer positions. The present technology may not use conventional wafer carriers in some embodiments, and may transfer specific wafers from one substrate support to a different substrate support within the transfer region.

Additionally, the use of a single gas source to deliver process gases to a number of chambers creates the possibility of uneven gas flow between the chambers and crosstalk between the chambers. The present technology overcomes these issues by incorporating passive flow control devices that ensure flow from the gas source is equal between each chamber. Additionally, the present technology may incorporate isolation valves that prevent cross-talk between chambers, as well as that prevent backstreaming into a remote plasma unit.

Although the remaining disclosure will routinely identify specific structures, such as four-position chamber systems, for which the present structures and methods may be employed, it will be readily understood that the systems and methods are equally applicable to any number of structures and devices that may benefit from the structural capabilities explained. Accordingly, the technology should not be considered to be so limited as for use with any particular structures alone. Moreover, although an exemplary tool system will be described to provide foundation for the present technology, it is to be understood that the present technology can be incorporated with any number of semiconductor processing chambers and tools that may benefit from some or all of the operations and systems to be described.

FIG. 1 shows a top plan view of one embodiment of a substrate processing tool or processing system 100 of deposition, etching, baking, and curing chambers according to some embodiments of the present technology. In the figure, a set of front-opening unified pods 102 supply substrates of a variety of sizes that are received within a factory interface 103 by robotic arms 104a and 104b and placed into a load lock or low pressure holding area 106 before being delivered to one of the substrate processing regions 108, positioned in chamber systems or quad sections 109a-c, which may each be a substrate processing system having a transfer region fluidly coupled with a plurality of processing regions 108. Although a quad system is illustrated, it is to be understood that platforms incorporating standalone chambers, twin chambers, and other multiple chamber systems are equally encompassed by the present technology. A second robotic arm 110 housed in a transfer chamber 112 may be used to transport the substrate wafers from the holding area 106 to the quad sections 109 and back, and second robotic arm 110 may be housed in a transfer chamber with which each of the quad sections or processing systems may be connected. Each substrate processing region 108 can be outfitted to perform a number of substrate processing operations including any number of deposition processes including cyclical layer deposition, atomic layer deposition, chemical vapor deposition, physical vapor deposition, as well as etch, preclean, anneal, plasma processing, degas, orientation, and other substrate processes.

Each quad section 109 may include a transfer region that may receive substrates from, and deliver substrates to, second robotic arm 110. The transfer region of the chamber system may be aligned with the transfer chamber having the second robotic arm 110. In some embodiments the transfer region may be laterally accessible to the robot. In subsequent operations, components of the transfer sections may vertically translate the substrates into the overlying processing regions 108. Similarly, the transfer regions may also be operable to rotate substrates between positions within each transfer region. The substrate processing regions 108 may include any number of system components for depositing, annealing, curing and/or etching a material film on the substrate or wafer. In one configuration, two sets of the processing regions, such as the processing regions in quad section 109a and 109b, may be used to deposit material on the substrate, and the third set of processing chambers, such as the processing chambers or regions in quad section 109c, may be used to cure, anneal, or treat the deposited films. In another configuration, all three sets of chambers, such as all twelve chambers illustrated, may be configured to both deposit and/or cure a film on the substrate.

As illustrated in the figure, second robotic arm 110 may include two arms for delivering and/or retrieving multiple substrates simultaneously. For example, each quad section 109 may include two accesses 107 along a surface of a housing of the transfer region, which may be laterally aligned with the second robotic arm. The accesses may be defined along a surface adjacent the transfer chamber 112. In some embodiments, such as illustrated, the first access may be aligned with a first substrate support of the plurality of substrate supports of a quad section. Additionally, the second access may be aligned with a second substrate support of the plurality of substrate supports of the quad section. The first substrate support may be adjacent to the second substrate support, and the two substrate supports may define a first row of substrate supports in some embodiments. As shown in the illustrated configuration, a second row of substrate supports may be positioned behind the first row of substrate supports laterally outward from the transfer chamber 112. The two arms of the second robotic arm 110 may be spaced to allow the two arms to simultaneously enter a quad section or chamber system to deliver or retrieve one or two substrates to substrate supports within the transfer region.

Any one or more of the transfer regions described may be incorporated with additional chambers separated from the fabrication system shown in different embodiments. It will be appreciated that additional configurations of deposition, etching, annealing, and curing chambers for material films are contemplated by processing system 100. Additionally, any number of other processing systems may be utilized with the present technology, which may incorporate transfer systems for performing any of the specific operations, such as the substrate movement. In some embodiments, processing systems that may provide access to multiple processing chamber regions while maintaining a vacuum environment in various sections, such as the noted holding and transfer areas, may allow operations to be performed in multiple chambers while maintaining a particular vacuum environment between discrete processes.

Figure 2:
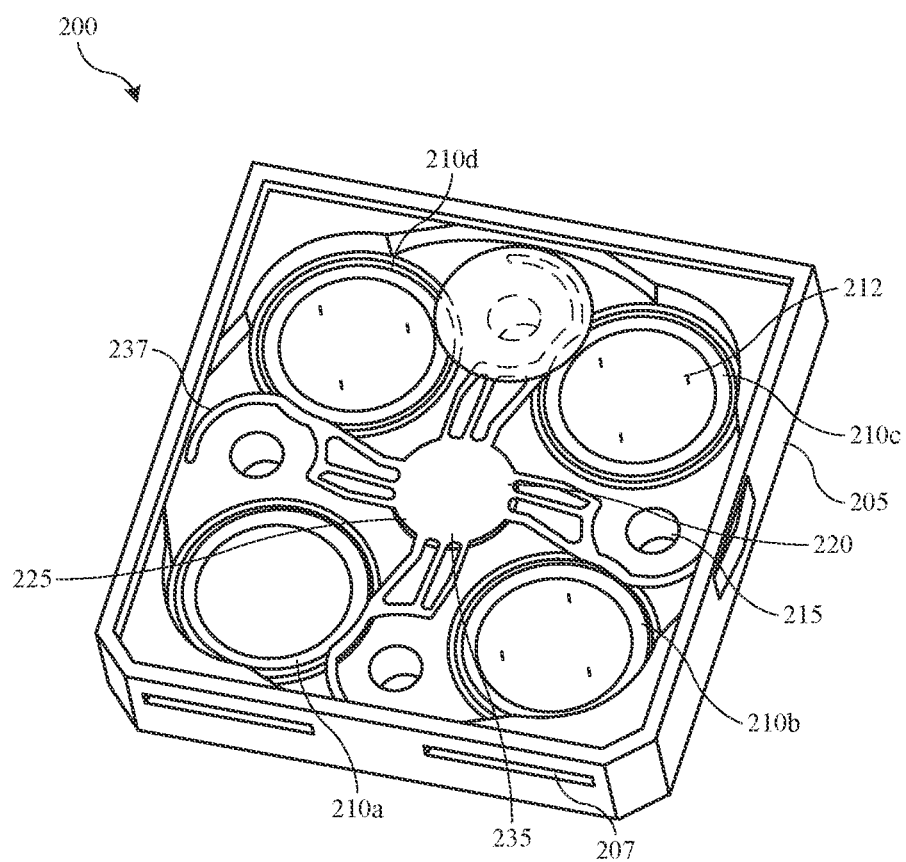
FIG. 2 shows a schematic isometric view of a transfer region of an exemplary chamber system according to some embodiments of the present technology.

As noted, processing system 100, or more specifically quad sections or chamber systems incorporated with processing system 100 or other processing systems, may include transfer sections positioned below the processing chamber regions illustrated. FIG. 2 shows a schematic isometric view of a transfer section of an exemplary chamber system 200 according to some embodiments of the present technology. FIG. 2 may illustrate additional aspects or variations of aspects of the transfer region described above, and may include any of the components or characteristics described. The system illustrated may include a transfer region housing 205, which may be a chamber body as discussed further below, defining a transfer region in which a number of components may be included. The transfer region may additionally be at least partially defined from above by processing chambers or processing regions fluidly coupled with the transfer region, such as processing chamber regions 108 illustrated in quad sections 109 of FIG. 1. A sidewall of the transfer region housing may define one or more access locations 207 through which substrates may be delivered and retrieved, such as by second robotic arm 110 as discussed above. Access locations 207 may be slit valves or other sealable access positions, which include doors or other sealing mechanisms to provide a hermetic environment within transfer region housing 205 in some embodiments. Although illustrated with two such access locations 207, it is to be understood that in some embodiments only a single access location 207 may be included, as well as access locations on multiple sides of the transfer region housing. It is also to be understood that the transfer section illustrated may be sized to accommodate any substrate size, including 200 mm, 300 mm, 450 mm, or larger or smaller substrates, including substrates characterized by any number of geometries or shapes.

Within transfer region housing 205 may be a plurality of substrate supports 210 positioned about the transfer region volume. Although four substrate supports are illustrated, it is to be understood that any number of substrate supports are similarly encompassed by embodiments of the present technology. For example, greater than or about three, four, five, six, eight, or more substrate supports 210 may be accommodated in transfer regions according to embodiments of the present technology. Second robotic arm 110 may deliver a substrate to either or both of substrate supports 210a or 210b through the accesses 207. Similarly, second robotic arm 110 may retrieve substrates from these locations. Lift pins 212 may protrude from the substrate supports 210, and may allow the robot to access beneath the substrates. The lift pins may be fixed on the substrate supports, or at a location where the substrate supports may recess below, or the lift pins may additionally be raised or lowered through the substrate supports in some embodiments. Substrate supports 210 may be vertically translatable, and in some embodiments may extend up to processing chamber regions of the substrate processing systems, such as processing chamber regions 108, positioned above the transfer region housing 205.

The transfer region housing 205 may provide access 215 for alignment systems, which may include an aligner that can extend through an aperture of the transfer region housing as illustrated and may operate in conjunction with a laser, camera, or other monitoring device protruding or transmitting through an adjacent aperture, and that may determine whether a substrate being translated is properly aligned. Transfer region housing 205 may also include a transfer apparatus 220 that may be operated in a number of ways to position substrates and move substrates between the various substrate supports. In one example, transfer apparatus 220 may move substrates on substrate supports 210a and 210b to substrate supports 210c and 210d, which may allow additional substrates to be delivered into the transfer chamber. Additional transfer operations may include rotating substrates between substrate supports for additional processing in overlying processing regions.

Transfer apparatus 220 may include a central hub 225 that may include one or more shafts extending into the transfer chamber. Coupled with the shaft may be an end effector 235. End effector 235 may include a plurality of arms 237 extending radially or laterally outward from the central hub. Although illustrated with a central body from which the arms extend, the end effector may additionally include separate arms that are each coupled with the shaft or central hub in various embodiments. Any number of arms may be included in embodiments of the present technology. In some embodiments a number of arms 237 may be similar or equal to the number of substrate supports 210 included in the chamber. Hence, as illustrated, for four substrate supports, transfer apparatus 220 may include four arms extending from the end effector. The arms may be characterized by any number of shapes and profiles, such as straight profiles or arcuate profiles, as well as including any number of distal profiles including hooks, rings, forks, or other designs for supporting a substrate and/or providing access to a substrate, such as for alignment or engagement.

The end effector 235, or components or portions of the end effector, may be used to contact substrates during transfer or movement. These components as well as the end effector may be made from or include a number of materials including conductive and/or insulative materials. The materials may be coated or plated in some embodiments to withstand contact with precursors or other chemicals that may pass into the transfer chamber from an overlying processing chamber.

Additionally, the materials may be provided or selected to withstand other environmental characteristics, such as temperature. In some embodiments, the substrate supports may be operable to heat a substrate disposed on the support. The substrate supports may be configured to increase a surface or substrate temperature to temperatures greater than or about 100° C., greater than or about 200° C., greater than or about 300° C., greater than or about 400° C., greater than or about 500° C., greater than or about 600° C., greater than or about 700° C., greater than or about 800° C., or higher. Any of these temperatures may be maintained during operations, and thus components of the transfer apparatus 220 may be exposed to any of these stated or encompassed temperatures. Consequently, in some embodiments any of the materials may be selected to accommodate these temperature regimes, and may include materials such as ceramics and metals that may be characterized by relatively low coefficients of thermal expansion, or other beneficial characteristics.

Component couplings may also be adapted for operation in high temperature and/or corrosive environments. For example, where end effectors and end portions are each ceramic, the coupling may include press fittings, snap fittings, or other fittings that may not include additional materials, such as bolts, which may expand and contract with temperature, and may cause cracking in the ceramics. In some embodiments the end portions may be continuous with the end effectors, and may be monolithically formed with the end effectors. Any number of other materials may be utilized that may facilitate operation or resistance during operation, and are similarly encompassed by the present technology. The transfer apparatus 220 may include a number of components and configurations that may facilitate the movement of the end effector in multiple directions, which may facilitate rotational movement, as well as vertical movement, or lateral movement in one or more ways with the drive system components to which the end effector may be coupled.

Figure 3:
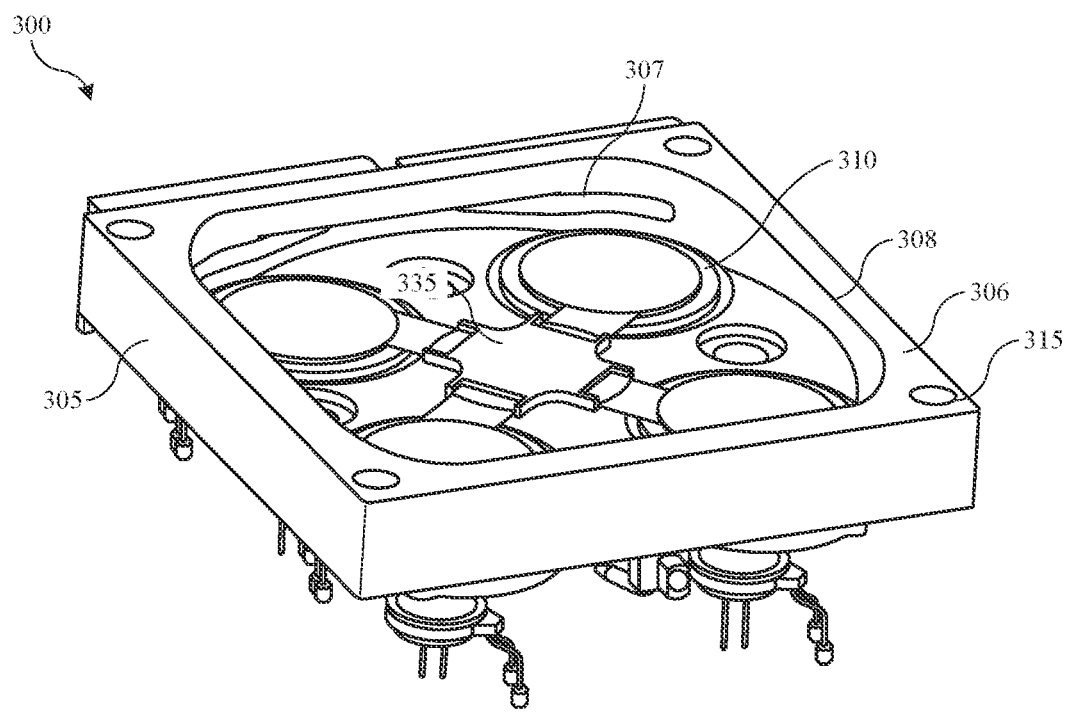
FIG. 3 shows a schematic isometric view of a transfer region of an exemplary chamber system according to some embodiments of the present technology.

FIG. 3 shows a schematic isometric view of a transfer region of a chamber system 300 of an exemplary chamber system according to some embodiments of the present technology. Chamber system 300 may be similar to the transfer region of chamber system 200 described above, and may include similar components including any of the components, characteristics, or configurations described above. FIG. 3 may also illustrate certain component couplings encompassed by the present technology along with the following figures.

Chamber system 300 may include a chamber body 305 or housing defining the transfer region. Within the defined volume may be a plurality of substrate supports 310 distributed about the chamber body as previously described. As will be described further below, each substrate support 310 may be vertically translatable along a central axis of the substrate support between a first position illustrated in the figure, and a second position where substrate processing may be performed. Chamber body 305 may also define one or more accesses 307 through the chamber body. A transfer apparatus 335 may be positioned within the transfer region and be configured to engage and rotate substrates among the substrate supports 310 within the transfer region as previously described. For example, transfer apparatus 335 may be rotatable about a central axis of the transfer apparatus to reposition substrates. The transfer apparatus 335 may also be laterally translatable in some embodiments to further facilitate repositioning substrates at each substrate support.

Chamber body 305 may include a top surface 306, which may provide support for overlying components of the system. Top surface 306 may define a gasket groove 308, which may provide seating for a gasket to provide hermetic sealing of overlying components for vacuum processing. Unlike some conventional systems, chamber system 300, and other chamber systems according to some embodiments of the present technology, may include an open transfer region within the processing chamber, and processing regions may be formed overlying the transfer region. Because of transfer apparatus 335 creating an area of sweep, supports or structure for separating processing regions may not be available. Consequently, the present technology may utilize overlying lid structures to form segregated processing regions overlying the open transfer region as will be described below. Hence, in some embodiments sealing between the chamber body and an overlying component may only occur about an outer chamber body wall defining the transfer region, and interior coupling may not be present in some embodiments. Chamber body 305 may also define apertures 315, which may facilitate exhaust flow from the processing regions of the overlying structures. Top surface 306 of chamber body 305 may also define one or more gasket grooves about the apertures 315 for sealing with an overlying component. Additionally, the apertures may provide locating features that may facilitate stacking of components in some embodiments.

Figure 4:
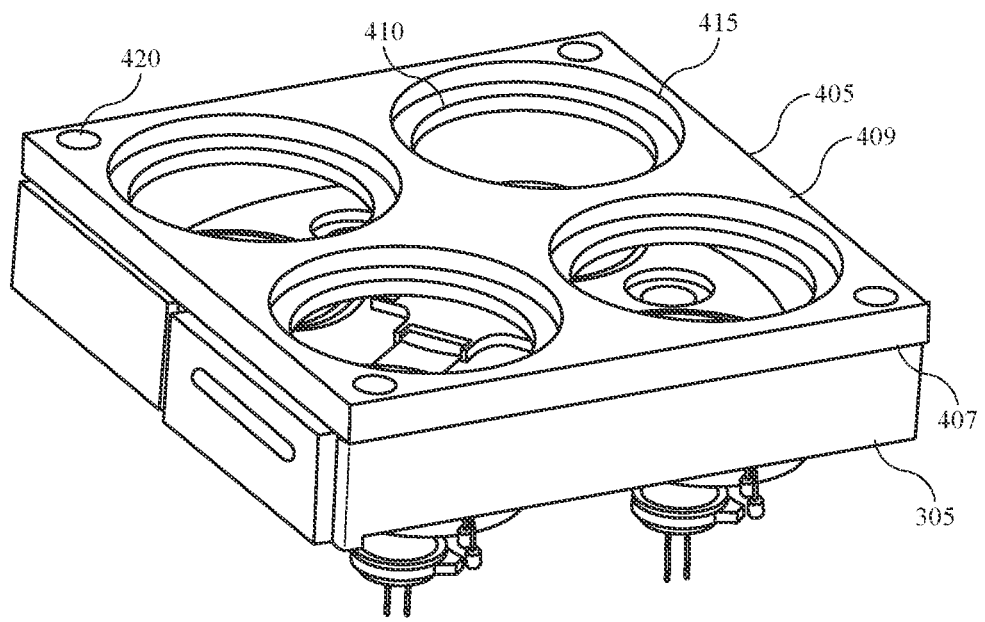
FIG. 4 shows a schematic isometric view of a transfer region of an exemplary chamber system according to some embodiments of the present technology.

FIG. 4 shows a schematic isometric view of overlying structures of chamber system 300 according to some embodiments of the present technology. For example, in some embodiments a first lid plate 405 may be seated on chamber body 305. First lid plate 405 may by characterized by a first surface 407 and a second surface 409 opposite the first surface. First surface 407 of the first lid plate 405 may contact chamber body 305, and may define companion grooves to cooperate with grooves 308 discussed above to produce a gasket channel between the components. First lid plate 405 may also define apertures 410, which may provide separation of overlying regions of the transfer chamber to form processing regions for substrate processing.

Apertures 410 may be defined through first lid plate 405, and may be at least partially aligned with substrate supports in the transfer region. In some embodiments, a number of apertures 410 may equal a number of substrate supports in the transfer region, and each aperture 410 may be axially aligned with a substrate support of the plurality of substrate supports. As will be described further below, the processing regions may be at least partially defined by the substrate supports when vertically raised to a second position within the chamber systems. The substrate supports may extend through the apertures 410 of the first lid plate 405. Accordingly, in some embodiments apertures 410 of the first lid plate 405 may be characterized by a diameter greater than a diameter of an associated substrate support. Depending on an amount of clearance, the diameter may be less than or about 25% greater than a diameter of a substrate support, and in some embodiments may be less than or about 20% greater, less than or about 15% greater, less than or about 10% greater, less than or about 9% greater, less than or about 8% greater, less than or about 7% greater, less than or about 6% greater, less than or about 5% greater, less than or about 4% greater, less than or about 3% greater, less than or about 2% greater, less than or about 1% greater than a diameter of a substrate support, or less, which may provide a minimum gap distance between the substrate support and the apertures 410.

First lid plate 405 may also include a second surface 409 opposite first surface 407. Second surface 409 may define a recessed ledge 415, which may produce an annular recessed shelf through the second surface 409 of first lid plate 405. Recessed ledges 415 may be defined about each aperture of the plurality of apertures 410 in some embodiments. The recessed shelf may provide support for lid stack components as will be described further below. Additionally, first lid plate 405 may define second apertures 420, which may at least partially define pumping channels from overlying components described below. Second apertures 420 may be axially aligned with apertures 315 of the chamber body 305 described previously.

Figure 5:
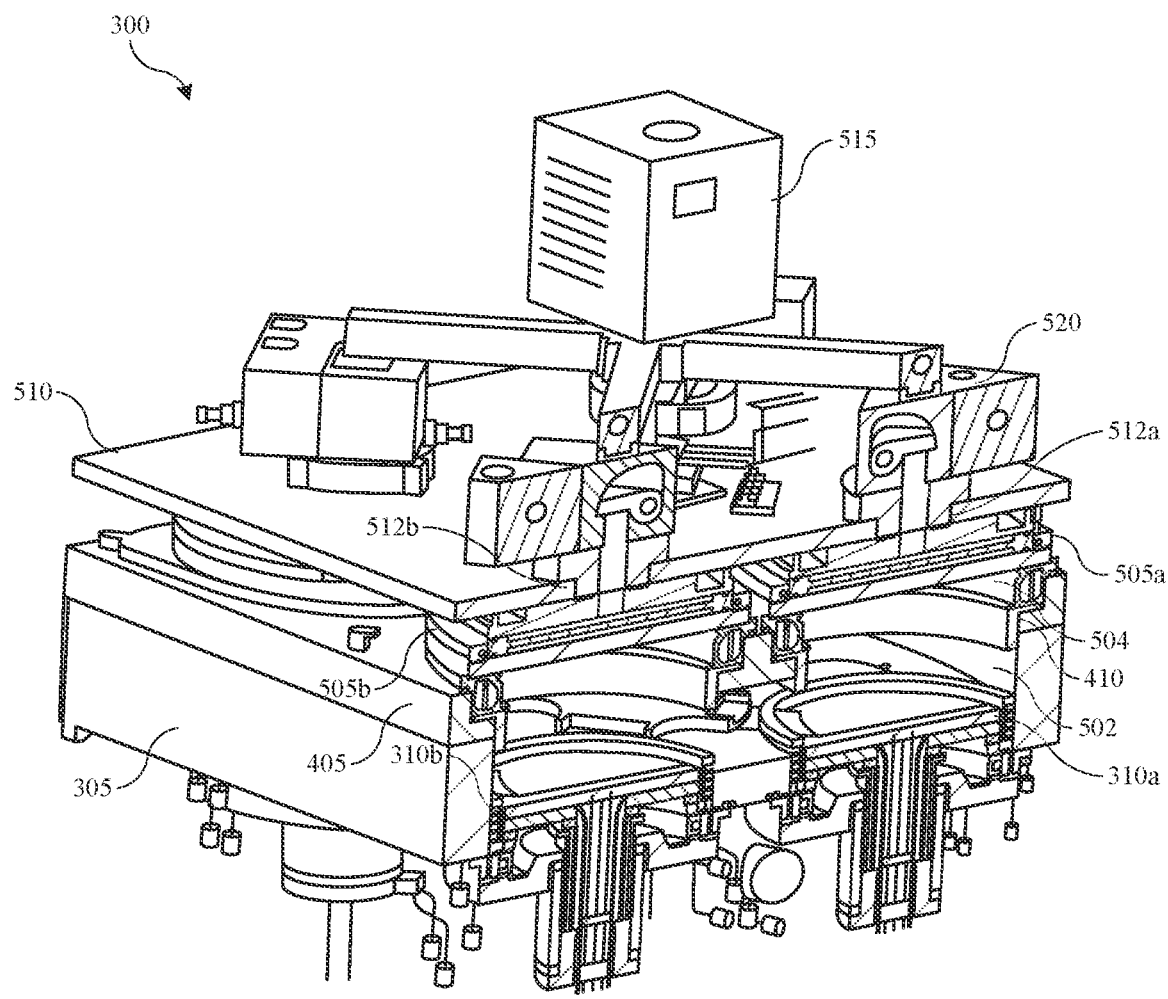
FIG. 5 shows a schematic partial isometric view of a chamber system according to some embodiments of the present technology.

FIG. 5 shows a schematic partial isometric view of chamber system 300 according to some embodiments of the present technology. The figure may illustrate a partial cross-section through two processing regions and a portion of a transfer region of the chamber system. For example, chamber system 300 may be a quad section of processing system 100 described previously, and may include any of the components of any of the previously described components or systems.

Chamber system 300, as developed through the figure, may include a chamber body 305 defining a transfer region 502 including substrate supports 310, which may extend into the chamber body 305 and be vertically translatable as previously described. First lid plate 405 may be seated overlying the chamber body 305, and may define apertures 410 producing access for processing region 504 to be formed with additional chamber system components. Seated about or at least partially within each aperture may be a lid stack 505, and chamber system 300 may include a plurality of lid stacks 505, including a number of lid stacks equal to a number of apertures 410 of the plurality of apertures. Each lid stack 505 may be seated on the first lid plate 405, and may be seated on a shelf produced by recessed ledges through the second surface of the first lid plate. The lid stacks 505 may at least partially define processing regions 504 of the chamber system 300.

As illustrated, processing regions 504 may be vertically offset from the transfer region 502, but may be fluidly coupled with the transfer region. Additionally, the processing regions may be separated from the other processing regions. Although the processing regions may be fluidly coupled with other processing regions through the transfer region from below, the processing regions may be fluidly isolated, from above, from each of the other processing regions. Each lid stack 505 may also be aligned with a substrate support in some embodiments. For example, as illustrated, lid stack 505a may be aligned over substrate support 310a, and lid stack 505b may be aligned over substrate support 310b. When raised to operational positions, such as a second position, the substrates may deliver substrates for individual processing within the separate processing regions. When in this position, as will be described further below, each processing region 504 may be at least partially defined from below by an associated substrate support in the second position.

FIG. 5 also illustrates embodiments in which a second lid plate 510 may be included for the chamber system. Second lid plate 510 may be coupled with each of the lid stacks, which may be positioned between the first lid plate 405 and the second lid plate 510 in some embodiments. As will be explained below, the second lid plate 510 may facilitate accessing components of the lid stacks 505. Second lid plate 510 may define a plurality of apertures 512 through the second lid plate. Each aperture of the plurality of apertures may be defined to provide fluid access to a specific lid stack 505 or processing region 504. A remote plasma unit 515 may optionally be included in chamber system 300 in some embodiments, and may be supported on second lid plate 510. In some embodiments, remote plasma unit 515 may be fluidly coupled with each aperture 512 of the plurality of apertures through second lid plate 510. Isolation valves 520 may be included along each fluid line to provide fluid control to each individual processing region 504. For example, as illustrated, aperture 512a may provide fluid access to lid stack 505a. Aperture 512a may also be axially aligned with any of the lid stack components, as well as with substrate support 310a in some embodiments, which may produce an axial alignment for each of the components associated with individual processing regions, such as along a central axis through the substrate support or any of the components associated with a particular processing region 504. Similarly, aperture 512b may provide fluid access to lid stack 505b, and may be aligned, including axially aligned with components of the lid stack as well as substrate support 310b in some embodiments.

Figure 6:
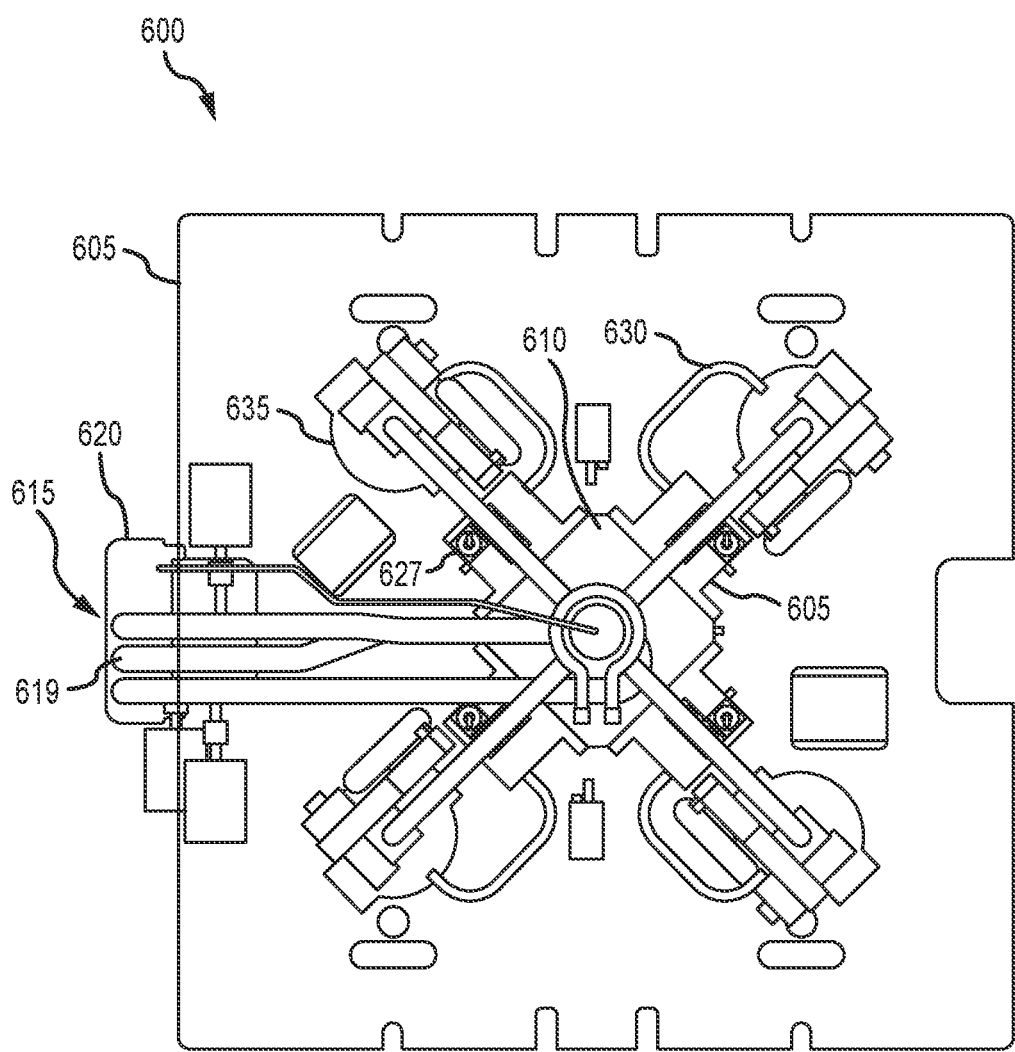
FIG. 6 shows a schematic top plan view of an exemplary processing system according to some embodiments of the present technology.

FIG. 6 shows a schematic top plan view of one embodiment of semiconductor processing system 600 according to some embodiments of the present technology. The figure may include components of any of the systems illustrated and described previously, and may also show further aspects of any of the previously described systems. It is to be understood that the illustration may also show exemplary components as would be seen on any quad section 109 described above.

Semiconductor processing system 600 may include a lid plate 605, which may be similar to second lid plate 510 previously described. For example, the lid plate 605 may define a number of apertures, similar to apertures 512, which provide access to a number of processing chambers positioned beneath the lid plate 605. Each aperture of the plurality of apertures may be defined to provide fluid access to a specific lid stack, processing chamber, and/or processing region.

A gas splitter 610 may be seated on a top surface of the lid plate 605. For example, the gas splitter 610 may be centered between the apertures of the lid plate 605. The gas splitter 610 may be fluidly coupled with a number of input weldments 615 that deliver gases, such as precursors, plasma effluents, and/or purge gases from a number of gas sources to the gas splitter 610. For example, each of the input weldments 615 may extend vertically from gas sources positioned below the lid plate 605 and pass through a feedthrough plate 620. A portion of the input weldments 615 above the feedthrough plate 620 may be bent horizontally and may direct the gases toward the gas splitter 610. In some embodiments, some or all of the input weldments 615 may be disposed within heater jackets 619 that help prevent heat loss along the length of the input weldments 615.

As will be discussed further below, the gas splitter 610 may receive gases from the input weldments 615 and may recursively split the gas flows into a greater number of gas outputs that are each interfaced with a respective one of a number of valve blocks 625. The valve blocks 625 may interface with one or more valves 627 that help control flow of gases through the valve block 625. For example, actuation of the valves 627 at each valve block 625 may control whether purge and/or process gases are flowed to a respective processing chamber or are diverted away from the processing chamber to another location of the system 600. For example, outlets of each of the valve blocks 625 may each be fluidly coupled with an output weldment 630, which may deliver the purge gas and/or process gas to an output manifold 635 associated with a particular processing chamber. For example, an output manifold 635 may be positioned over each aperture formed within the lid plate 605 and may be fluidly coupled with the lid stack components to deliver one or more gases to a processing region of a respective processing chamber.

Figure 7:
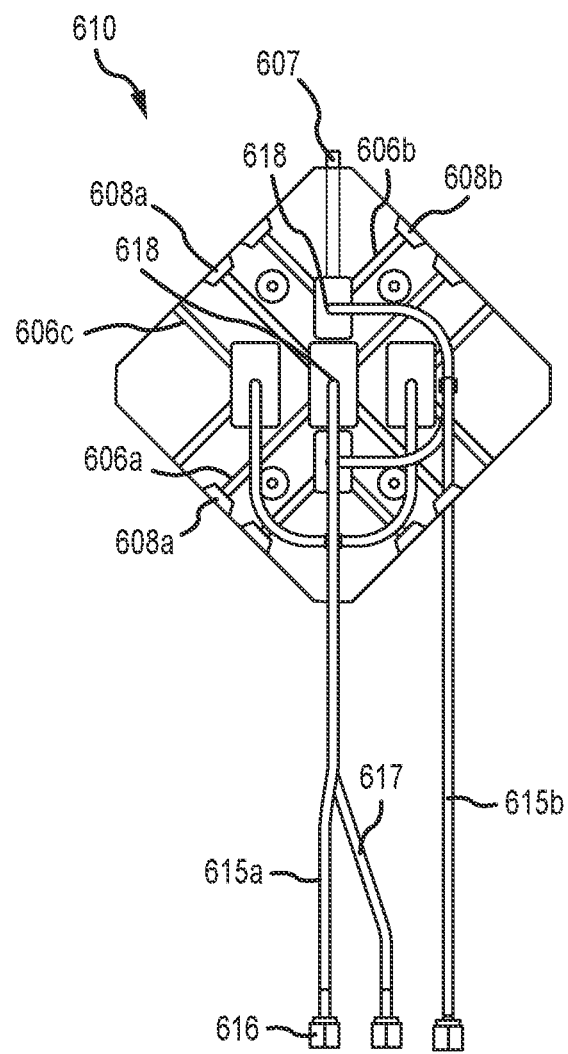
FIG. 7 shows a schematic top plan view of an exemplary gas splitter according to some embodiments of the present technology.

FIG. 7 shows a schematic top plan view of the gas splitter 610 interfaced with a number of input weldments 615. Each of the input weldments 615 defines a gas channel formed between an inlet 616 and an outlet 618. Outlets 618 of each of the input weldments 615 may be coupled with a respective gas inlet of the gas splitter 610, which may enable gas to be flowed from each gas source through the input weldments 615 and into the gas splitter 610. In some embodiments, one or more of the input weldments 615 may have a single inlet 616 and may split into multiple outlets 618. For example, the illustrated embodiment includes a first input weldment 615a with a single inlet 616 and a single outlet 618 that interfaces with a gas inlet in a center of the gas splitter 610. A second input weldment 615b has a single inlet 616, with the gas channel splitting into two sections that direct gas flow to two separate outlets 618 that are each coupled with gas inlets of the gas splitter 610. As just one example, the first input weldment 615a may deliver a deposition gas, such as, but not limited to, tetraethyl orthosilicate ("TEOS") or any other silicon-containing precursor, to a single gas inlet of the gas splitter 610. The second input weldment 615b may deliver an oxygen-containing precursor, such as diatomic oxygen, ozone, and/or nitrogen-containing precursors that incorporate oxygen, water, alcohol, or other materials to two or more gas inlet of the gas splitter 610. In some embodiments, one or more divert weldments 617 may be coupled with the gas splitter 610 to direct gases away from the processing chambers and the gas splitter 610, such as to external gas containers. Such an arrangement may enable up to three different chemistries to be delivered to a processing chamber (e.g., gas from just first input weldment 615a, gas from just second input weldment 615b, or gas from both the first input weldment 615a and the second input weldment 615b). As illustrated, divert weldment 617 includes two branches that each couple with the gas splitter 610. Gas flow through each of these branches joins and is flowed away from the gas splitter 610. It will be understood that other arrangements of weldments are possible, including arrangements that include more or fewer weldments, with greater number of weldments enabling greater numbers of chemistries of gases to be delivered to the processing chambers with a single weldment arrangement.

The gas splitter 610 may define a number of gas channels 606 that extend between and fluidly couple the gas inlets of the gas splitter 610 with gas outlets 608 of the gas splitter 610. At least some of the gas channels 606 may split gas flow from a single gas inlet to multiple gas outlets 608 such that the gas splitter 610 includes a greater number of gas outlets 608 than gas inlets. As illustrated, four gas channels 606a extend radially outward from the outlet 618 of the first input weldment 615a and split flow from the first input weldment 615a to deliver gas to four different gas outlets 608a. Each of the gas outlets 608a may be positioned on a different side of the gas splitter 610. This allows a single gas source to provide equal flow rates of gas through each of the four gas outlets 608a using a single input weldment 615 (with a single outlet) and single gas splitter 610. Two gas channels 606b may be fluidly coupled with each of the outlets 618 of the second input weldment 615b. Each gas channel 606b may deliver gas to a different one of four gas outlets 608b, with each of the gas outlets 608b being positioned on a different side of the gas splitter 610. Such a design enables a single input weldment 615 that splits into two outlets to deliver gas to four different gas outlets 608b. Each side of the gas splitter 610 may include an inlet for a divert gas channel 606c. Each divert gas channel 606c may couple with the divert weldment 617. It is to be understood that the arrangement of gas inlets, gas outlets 608, and gas channels 606 is merely representative of a single embodiment of a gas splitter 610 and that numerous variations in placement and orientation of the gas inlets, gas outlets 608, and/or gas channels 606 is possible. Additionally, gas channels 606 may be arranged to provide any number of flow paths, including single flow paths, from a given gas inlet. Gas splitter 610 may be designed to accommodate any number of input weldments from various gas sources, allowing the number of chemistries enabled by the gas splitter to be scaled to meet the demands of a particular processing operation.

In some embodiments, the gas splitter 610 may include a heat source. For example, a heater cartridge 607 may be coupled with and/or embedded within a body of the gas splitter 610. In some embodiments, the heat cartridge 607 may be positioned at a center of the gas splitter 610, which may provide a uniform temperature gradient across the gas splitter 610. By providing a heat source within the gas splitter 610, greater temperature control may be afforded to the system 600, which may improve the quality and uniformity of film deposition operations. The heat source may heat the gas splitter 610 to temperatures of about or greater than 75° C., about or greater than 100° C., about or greater than 125° C., about or greater than 150° C., about or greater than 175° C., about or greater than 200° C., or more.

Figure 8:
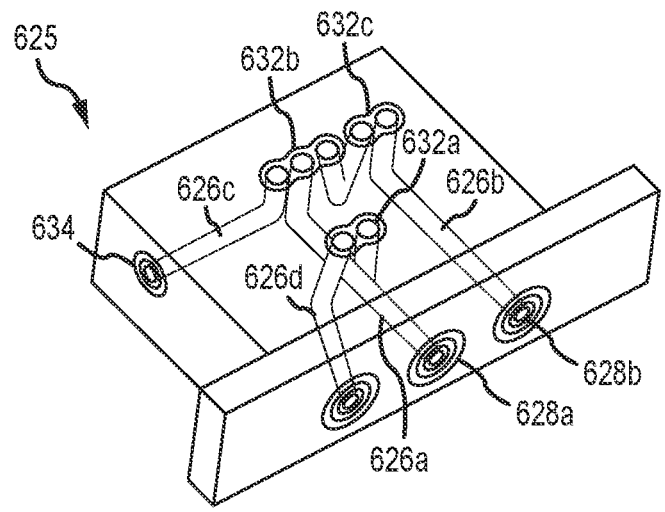
FIG. 8 shows a schematic isometric view of an exemplary valve block according to some embodiments of the present technology.

FIG. 8 shows a schematic isometric view of one of the valve blocks 625. Each of the valve blocks 625 may define a number of gas lumens 626 that may deliver gas from an inlet 628 to one or more valve locations 632. For example, a first gas lumen 626a may extend from inlet 628a (which may be fluidly coupled with one of the gas outlets 608a of the gas splitter 610 to flow a deposition gas) and may be fluidly coupled with a first valve location 632a and a second valve location 632b. A valve (such as valve 627) may be coupled with the first valve location 632a, which may operate to selectively divert gases flowed through the first gas lumen 626a to a divert gas lumen 626d, which may be fluidly coupled with divert gas channel 606c of the gas splitter 610. A valve may be coupled with the second valve location 632a, which may operate to selectively flow gases through a delivery gas lumen 626c to a delivery outlet 634. The delivery outlet 634 may be coupled with one of the output weldments 630 to deliver gases to one of the processing chambers via one of the output manifolds 635. In some embodiments, valves interfaced with a particular valve block 625 may divert flow of a deposition gas through the divert gas lumen 626d while a flow rate of the deposition gas is being ramped up to a full flow rate. Once a full flow rate is reached, the valve may switch to deliver a full stable flow rate of deposition gas to the processing chamber via the delivery outlet 634. A second gas lumen 626b may extend from inlet 628b (which may be fluidly coupled with one of the gas outlets 608b of the gas splitter 610) and may be fluidly coupled with a third valve location 632c. A valve may be coupled with the third valve location 632c, which may operate to selectively direct gases flowed through the second gas lumen 626b to a the second valve location 632b for subsequent delivery to the delivery outlet 634.

Figure 9:
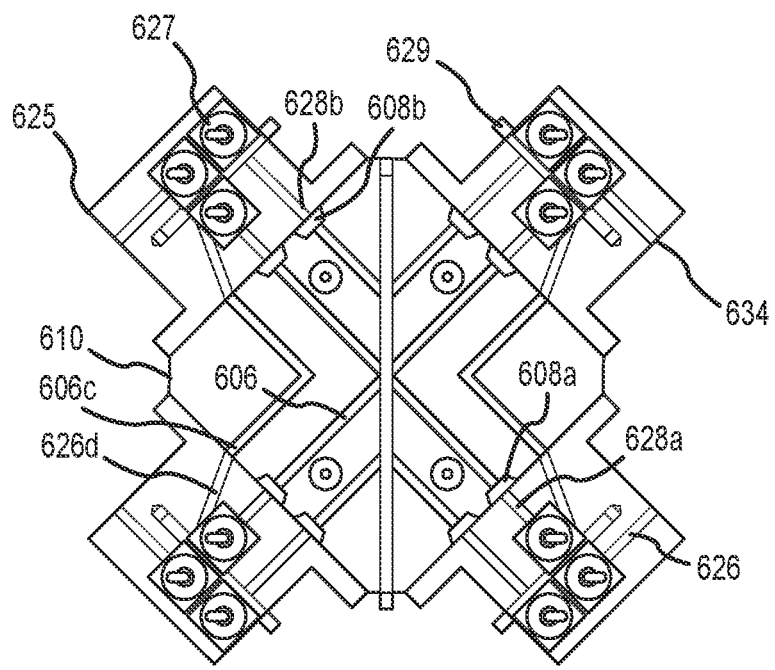
FIG. 9 shows a schematic top plan view of an exemplary interface between a gas splitter and a number of valve blocks according to some embodiments of the present technology.

FIG. 9 shows a schematic top plan view of the gas splitter 610 interfaced with a number of valve blocks 625. As illustrated, the gas splitter 610 has four primary sides, with a separate valve block 625 interfaced with each side of the gas splitter 610. However, it will be understood that other numbers of valve block 625 may be interfaced with a single gas splitter. In some embodiments, a number of valve blocks 625 may match a number of processing chambers present within the processing system 600 such that each processing chamber may have a dedicated valve block 625. This enables gas flows to be switched at each valve block 625 independently of one another, which may allow gas flow to be tuned in a manner that emulates a processing system that has separate gas sources for each processing chamber. For example, a deposition gas may be flowed to all four processing chambers via the gas splitter 610 and the valve blocks 625. If a deposition rate in one or more of the chambers is higher than the other chambers, the valves 627 and valve block 625 associated with the chamber(s) with the high deposition rate may divert flow of the deposition gas away from the respective chamber(s) to tune a deposition rate individual chambers.

When the gas splitter 610 is interfaced with the valve blocks 625, the gas outlets 608 of the gas splitter 610 may be aligned and interfaced with respective inlets 628 of the valve blocks 625 to provide gas flow paths from the gas splitter 610 to the delivery gas outlet 634 and/or to provide divert flow paths between the valve blocks 625 and the gas splitter 610. For example, the gas outlets 608a may each be interfaced with one of the inlets 628a of the valve blocks 625 and the gas outlets 608b may each be interfaced with one of the inlets 628b of the valve blocks 625. Exposed ends of each of the divert channels 606c of the gas splitter 610 may be interfaced with an output of the divert gas lumen 626d of one of the valve blocks 625.

In some embodiments, each valve block 625 may include a heat source. For example, a heater cartridge 629 may be coupled with and/or embedded within a body of the valve block 625. In some embodiments, the heat cartridge 629 may be positioned proximate the first gas lumen 626*a* (which may flow a process gas, such as TEOS), which may provide heat to the process gas. By providing a heat source within the valve block 625, greater temperature control may be afforded to the system 600, which may improve the quality and uniformity of film deposition operations. The heat source may heat the valve block 625 to temperatures of about or greater than 75° C., about or greater than 100° C., about or greater than 125° C., about or greater than 150° C., about or greater than 175° C., about or greater than 200° C., or more.

Figure 10A:
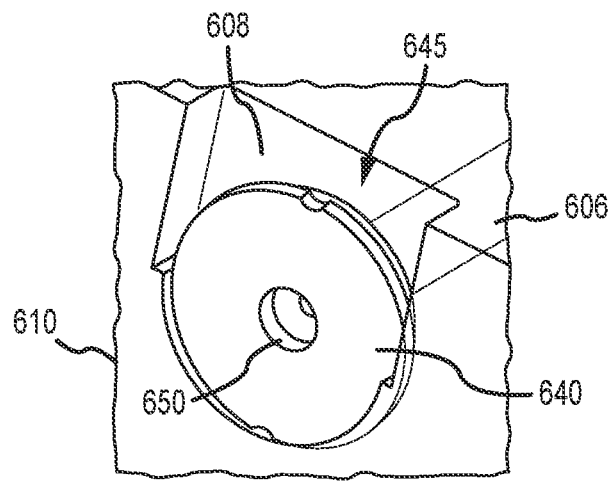
FIG. 10A shows a schematic isometric view of an exemplary choke plate according to some embodiments of the present technology.
Figure 10B:
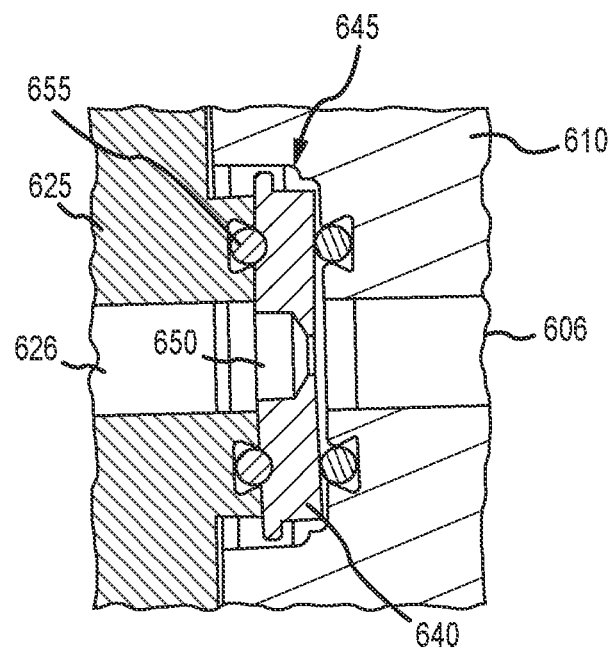
FIG. 10B shows a schematic cross-sectional top plan view of an exemplary choke plate according to some embodiments of the present technology.

The interfaces between the gas splitter 610 and each of the valve blocks 625 may include a choke. For example, an opening of each gas outlet 608 of the gas splitter 610 and/or an opening of each inlet 628 of the valve blocks 625 may include a choke. The choke may be in the form of a choke plate that defines an aperture having a reduced diameter relative to the gas channels 606 and/or gas lumens 626. FIG. 10A shows a schematic isometric view of one embodiment of a choke plate 640 secured with a gas outlet 608 of gas splitter 610 (although some embodiments may alternatively or additionally include a choke plate at an inlet 628 of a valve block 625). The choke plate 640 may be received and secured within a slot 645 formed at the gas outlet 608. In some embodiments, one or more O-rings 655 may be used to seal an interface between a body of the choke plate 640 and faces of the gas splitter 610 and/or valve block 625 to prevent any gases flowing through the choke plate 640 from leaking out of the interface as illustrated in the schematic cross-sectional top elevation view of FIG. 10B. The choke plate 640 may define a central orifice 650 that has a diameter that is smaller than diameters of the gas channels 606 and gas lumens 626. As illustrated, an upstream side of the central orifice 650 may have a smaller diameter than a downstream side of the central orifice 650. For example, a diameter of the central orifice 650 may taper and/or abruptly increase in diameter from the upstream side of the choke plate 640 to the downstream side. In other embodiments, the central orifice 650 may have a constant diameter across a thickness of the choke plate 640. The reduced diameter of the central orifice 650 relative to the diameters of gas channels 606 and gas lumens 626 enables the central orifice 650 to serve as a passive flow control device that enables downstream components (including valve blocks, output weldments, manifolds, lid stacks, etc.) to be modified or replaced without the need for any further flow rate tuning. Such modifications may be made without further flow rate tuning as long as the pressure upstream of the choke plates 640 stays the same at each interface of the gas splitter 610 and the valve blocks 625, which may be achieved by maintaining the same sizes of central orifice 650 at each interface location. The choke point provided by the central orifice 650 ensures that the flow rate through the central orifice 650 is a function of only upstream pressure, as an amount of gas flowing through the choke point depends only on pressure upstream of the central orifices 650.

O-rings or gaskets may be seated between each component of the system 600. In particular, O-rings or gaskets may be seated between couplings of various gas lines, which may help seal the component connections and prevent gas leakage in some embodiments.

Figure 11:
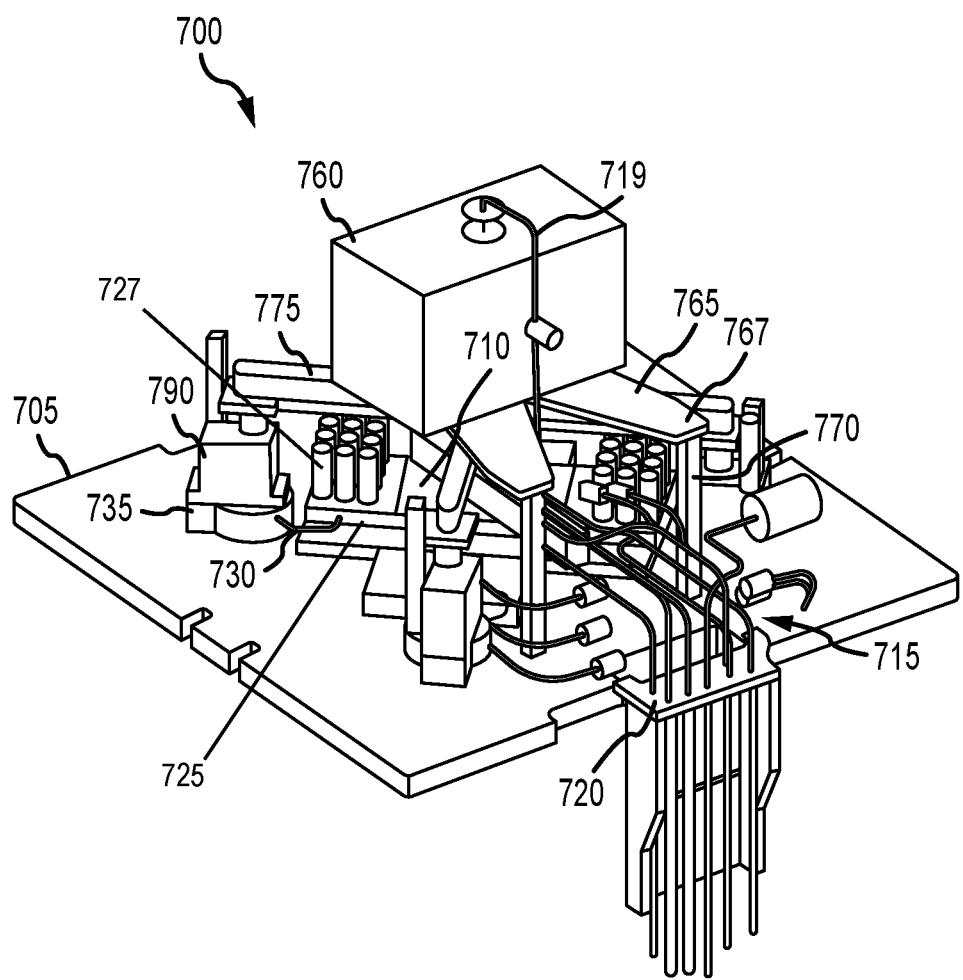
FIG. 11 shows a schematic isometric view of an exemplary processing system according to some embodiments of the present technology.

FIG. 11 shows a schematic top plan view of one embodiment of semiconductor processing system 700 according to some embodiments of the present technology. The figure may include components of any of the systems illustrated and described previously, including system 600, and may also show further aspects of any of the previously described systems. It is to be understood that the illustration may also show exemplary components as would be seen on any quad section 109 described above.

Semiconductor processing system 700 may include a lid plate 705, which may be similar to second lid plate 510 previously described. For example, the lid plate 705 may define a number of apertures, similar to apertures 512, which provide access to a number of processing chambers positioned beneath the lid plate. System 700 may include a number of input weldments 715 that extend upward from a number of gas source. The input weldments 715 may pass through and/or otherwise be mounted on a feedthrough plate 720 before coupling with gas channels formed within a gas splitter 710. The gas splitter 710 may be interfaced with a number of valve blocks 725, which may include a number of valves 727 that control gas flow to each processing chamber and/or through a divert channel. Each valve block 725 may be fluidly coupled with one of a number of output manifolds 735 via an output weldment 730. Each of the output manifolds 735 may be positioned over one of the apertures formed in the lid plate 705 and may be in fluid communication with one or more components of a lid stack and processing chamber positioned beneath each aperture.

A remote plasma unit 760 may be supported atop the lid plate 705 and may be fluidly coupled with each of the output manifolds 730. For example, as will be discussed further below, each output manifold 730 may define a central aperture that may be fluidly coupled with the remote plasma unit 760 using a manifold assembly. The remote plasma unit 760 may be positioned atop a support plate 765. A number of support legs 770 may extend between the top surface of the lid plate 705 and a bottom surface of the support plate 765 to elevate the remote plasma unit 760 to a height that is above each of the output manifolds 730. The support legs 770 may be positioned radially outward of the gas splitter 710 and valve blocks 725 to enable the support legs 770 to extend to the top surface of the lid plate 705. For example, the support plate 765 may have a first end and a second end that extend beyond the gas splitter 710 and valve blocks 725 and that may be coupled with the support legs 770. The first end of the support plate 765 may be supported by a single support leg 770. The second end of the support plate 765 may include two prongs 767 that are angled away from one another to define a central gap. Each of the prongs 767 may be coupled with a separate support leg 770, such that the central gap extends downward to the top surface of the lid plate 705. This central gap may provide access for the input weldments 715 (and possibly a divert weldment) to extend between the feedthrough plate 720 and the gas splitter 710. The central gap may also provide space for an additional input weldment 719 to extend between a gas source and the remote plasma unit 760. For example, a clean gas, such as argon, may be flowed to the remote plasma unit 760 via the additional input weldment 719.

As indicated above, the remote plasma unit 760 may be fluidly coupled with each of the output manifolds 730 using a manifold assembly. The remote plasma unit 760 may provide precursors, plasma effluents, and/or purge gas to the output manifolds 730 for subsequent delivery to the processing chambers for film deposition, chamber cleaning, and/or other processing operations. The manifold assembly may include a central manifold that may couple with a base of the remote plasma unit 760 and split flow from a single gas input of the remote plasma unit 760 to separate flows to each of the output manifolds 730. Each separate gas flow of the central manifold may be coupled with a side manifold 775 that defines at least a portion of a dedicated flow path to one of the output manifolds 730. In some embodiments, an isolation valve 790 may be positioned between each of the side manifolds 775 and output manifolds 730. The isolation valves 790 may provide fluid control to each processing chamber, as well as prevent backstreaming of gases to the remote plasma unit 760 and to prevent cross-talk between the various processing chambers.

Figure 12:
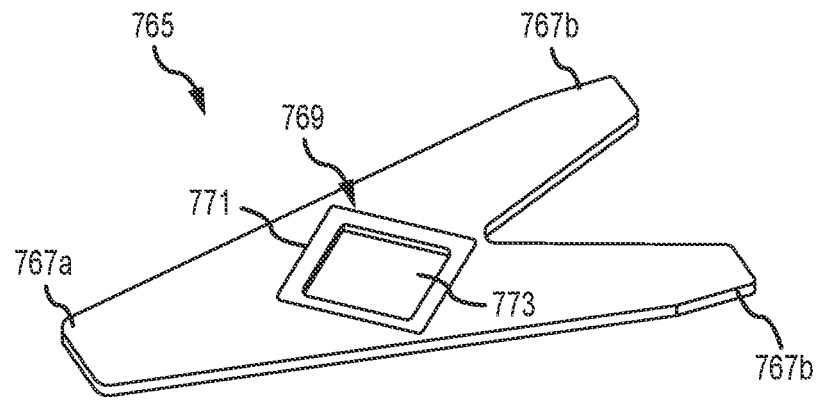
FIG. 12 shows a schematic isometric view of an exemplary support plate according to some embodiments of the present technology.

FIG. 12 shows a schematic isometric view of the support plate 765. As previously described, the support plate 765 may include a first end having a single prong 767a and a second end having two prongs 767b that are angled away from one another to define a central gap. Each of the prongs 767 may be coupled with a separate support leg. A medial portion of the support plate 765 may be mounted to a central manifold. For example, the medial portion of the support plate 765 may define a seat 769 for the central manifold. The seat 769 may include a recessed portion 771 that may receive a mounting flange of the central manifold. The recessed portion 771 may define a central aperture 773 that may receive a body of the central manifold.

Figure 13:
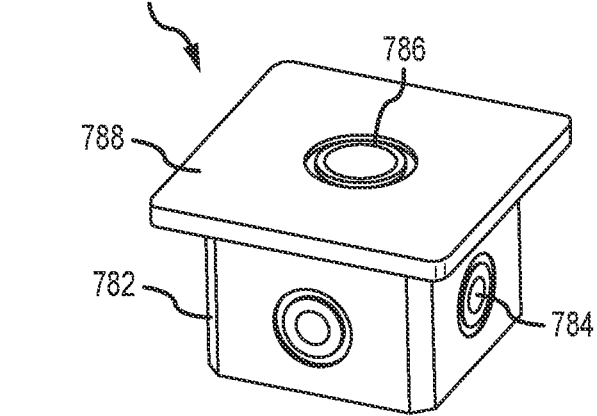
FIG. 13 shows a schematic isometric view of an exemplary central manifold according to some embodiments of the present technology.

FIG. 13 shows a schematic isometric view of one embodiment of a central manifold 780 according to some embodiments of the present technology. Central manifold 780 may be used in any of the preceding semiconductor processing systems, including systems 600 and 700. Central manifold 780 may include a body 782 that defines a number of apertures 784. Each aperture 784 may extend through a different side of the body 782, and a number of apertures 784 may be equal to a number of output manifolds in a processing system. As illustrated, the body 782 has four sides that each define an aperture 784. The body 782 may also define a vertically-oriented central aperture 786 that extends through a top surface of the body 782 and may be in fluid communication with each of the apertures 784. The top surface of the body 782 may include a mounting flange 788. The body 782 of the central manifold 780 may be inserted within a central aperture of a support plate (such as central aperture 773 of support plate 765), with the mounting flange 788 received within a recessed portion (such as recessed portion 771) of the support plate. The top surface of the mounting flange 788 may then be coupled with a bottom surface of a remote plasma unit. An outlet of the remote plasma unit may be aligned with the central aperture 786 such that gas flowed through the outlet is split between the apertures 784 and delivered to each output manifold via a side manifold, such as side manifold 775.

Figure 14:
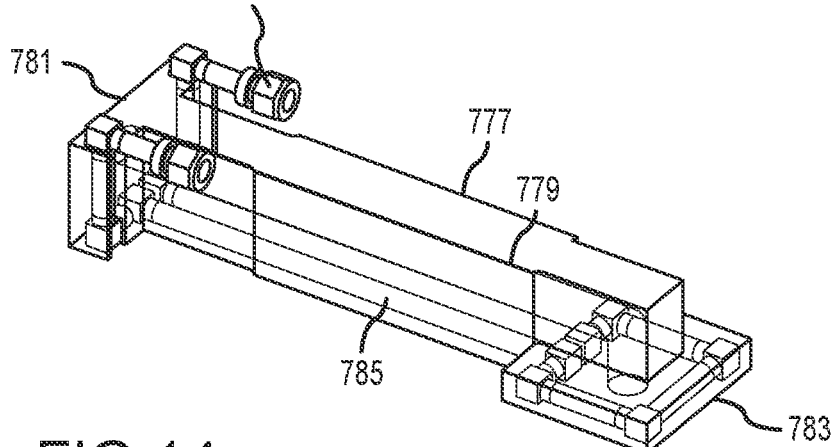
FIG. 14 shows a schematic isometric view of an exemplary side manifold according to some embodiments of the present technology.

FIG. 14 shows a schematic isometric view of side manifold 775. Side manifold 775 may include a body 777 that defines a fluid lumen 779 that extends through at least a portion of the body 777. In some embodiments, a first end of the fluid lumen 779 may extend through a vertical face at a proximal end the body 777 and continue in a generally horizontal direction. The fluid lumen 779 may bend such that a second end of the fluid lumen 779 may extend through a horizontal face at a distal end of the body 777. The proximal end of the body 777 may include a first mounting flange 781 that may be used to couple the side manifold 775 with a central manifold, such as central manifold 780, with the fluid lumen 779 of the side manifold 775 being aligned with an aperture of the central manifold. The distal end of the body 777 may include a second mounting flange 783 that may be used to couple the side manifold 775 with an output manifold 730 and/or one or more intervening components, such as isolation valve 790, with the fluid lumen 779 of the side manifold 775 being fluidly coupled with an aperture defined by the output manifold 730. The body 777 may also define a recess that may receive one or more cooling channel 785. For example, a cooling line 785 that extends along a length of the fluid lumen 779, as well as that at least partially encircles the fluid lumen within each of the first mounting flange 781 and second mounting flange 783. The body 777 may include and/or be coupled with two or more fluid ports 787, which may circulate a cooling fluid from a fluid source through the cooling line 785. For example, the fluid ports 787 may be positioned at a top of the first mounting flange 781. Cooling fluid may enter one of the fluid ports 787 and flow through the cooling channel 785 down and around a first side of the fluid lumen 779 within the first mounting flange 781. The cooling fluid may then flow along a length of the body 777 before flowing about the fluid lumen 779 within the second mounting flange 783. The cooling fluid may return to the other fluid port 787 in a reverse manner along another portion of the cooling channel 785. The use of a cooling line may help maintain a proper temperature of the manifold assembly, which may help reduce radical losses through the manifold assembly. Additionally, by actively cooling each of the mounting flanges, components directly coupled with the mounting flanges, such as the central manifold, may also be cooled using the cooling channel 785.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a heater" includes a plurality of such heaters, and reference to "the aperture" includes reference to one or more apertures and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

What is claimed is:

1. A semiconductor processing system, comprising:
a lid plate;
a gas splitter seated on the lid plate, the gas splitter defining a plurality of gas inlets and a plurality of gas outlets, wherein a number of the plurality of gas outlets is greater than a number of the plurality of gas inlets;
a plurality of valve blocks that are each interfaced with the gas splitter, wherein:
each of the plurality of valve blocks defines a number of gas lumens;
an inlet of each of the gas lumens is in fluid communication with one of the plurality of gas outlets; and
an interface between the gas splitter and each of the plurality of valve blocks comprises a choke having a diameter that is less than a diameter of each of the plurality of gas outlets and of each of the inlets of the gas lumens;
a plurality of output manifolds seated on the lid plate; and
a plurality of output weldments, each output weldment fluidly coupling an outlet of one of the gas lumens with a respective one of the output manifolds.

2. The semiconductor processing system of claim 1, wherein:
one of the gas lumens of the number of gas lumens of each of the plurality of valve blocks defines a divert lumen that directs gases away from a processing chamber.

3. The semiconductor processing system of claim 1, wherein:
the gas splitter defines a plurality of gas channels that extend between the plurality of gas inlets and the plurality of gas outlets.

4. The semiconductor processing system of claim 3, wherein:
at least one of the plurality of gas channels splits gas flow from a single gas inlet to two gas outlets of the plurality of gas outlets.

5. The semiconductor processing system of claim 1, further comprising:
a plurality of input weldments that fluidly couple a plurality of gas sources with the plurality of gas inputs of the gas splitter.

6. The semiconductor processing system of claim 1, wherein:
each of the gas splitter and the plurality of valve blocks comprise a heat source.

7. The semiconductor processing system of claim 1, wherein:
a remote plasma may be fluidly coupled with each of the plurality of output manifolds.

8. The semiconductor processing system of claim 7, further comprising:
a center manifold that may be fluidly coupled with the remote plasma; and
a plurality of side manifolds that are each fluidly coupled with one of a plurality of outlet ports of the center manifold, wherein each of the plurality of side manifolds defines a manifold gas lumen that is fluidly coupled with one of the plurality of output manifolds.

9. The semiconductor processing system of claim 8, wherein:
each of the plurality of side manifolds further comprises a cooling channel that extends along at least a portion of a length of the side manifold.

10. The semiconductor processing system of claim 1, further comprising:
a plurality of processing chambers positioned below the lid plate, wherein each processing chamber of the plurality of processing chambers defines a processing region that is fluidly coupled with one of the plurality of output manifolds.

11. A semiconductor processing system, comprising:
a gas splitter defining a plurality of gas inlets and a plurality of gas outlets, wherein a number of the plurality of gas outlets is greater than a number of the plurality of gas inlets;
a plurality of valve blocks that are each interfaced with the gas splitter, wherein:
each of the plurality of valve blocks defines a number of gas lumens;
an inlet of each of the gas lumens is in fluid communication with one of the plurality of gas outlets; and
an interface between the gas splitter and each of the plurality of valve blocks comprises a choke having a diameter that is less than a diameter of each of the plurality of gas outlets and of each of the inlets of the gas lumens; and
a plurality of output weldments, each output weldment of the plurality of output weldments fluidly coupling an outlet of one of the gas lumens with one of a plurality of output manifolds.

12. The semiconductor processing system of claim 11, further comprising:
a plurality of valves, each valve of the plurality of valves being coupled with at least one of the plurality of valve blocks.

13. The semiconductor processing system of claim 11, further comprising:
a plurality of input weldments that fluidly couple a plurality of gas sources with the plurality of gas inputs of the gas splitter.

14. The semiconductor processing system of claim 13, wherein:
at least some of the plurality of input weldments comprise a single input and define gas channels that split flow from the single input to a plurality of outputs.

15. The semiconductor processing system of claim 13, further comprising:
a heater jacket positioned about each of the plurality of input weldments.

16. The semiconductor processing system of claim 13, wherein:
a remote plasma may be fluidly coupled with each of the plurality of output manifolds.

17. The semiconductor processing system of claim 16, further comprising:
a support structure that elevates the remote plasma above a top surface of the gas splitter, the support structure comprising three support legs, wherein the plurality of input weldments extend between two of the support legs.

18. The semiconductor processing system of claim 16, further comprising:
a plurality of isolation valves, wherein each of the plurality of isolation valves is fluidly coupled between the remote plasma and one of the plurality of output manifolds.

19. The semiconductor processing system of claim 11, further comprising:
a lid plate that supports each of the plurality of output manifolds; and
a plurality of processing chambers positioned below the lid plate, wherein each processing chamber of the plurality of processing chambers defines a processing region that is fluidly coupled with one of the plurality of output manifolds.

\* \* \* \* \*